(12) United States Patent
Kim et al.

(10) Patent No.: US 10,161,804 B2
(45) Date of Patent: Dec. 25, 2018

(54) ELECTROMAGNETIC WAVE OSCILLATOR, PLASMA WAVE POWER EXTRACTOR AND ELECTROMAGNETIC WAVE DETECTOR

(71) Applicants: UNIST (Ulsan National Institute of Science and Technology), Ulsan (KR); Korea Advanced Institute of Science and Technology, Daejeon (KR)

(72) Inventors: Kyung Rok Kim, Ulsan (KR); Jong Ryul Park, Ulsan (KR); Sung Ho Kim, Ulsan (KR); Sang Gug Lee, Daejeon (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 114 days.

(21) Appl. No.: 15/306,927

(22) PCT Filed: Dec. 30, 2014

(86) PCT No.: PCT/KR2014/013049
§ 371 (c)(1),
(2) Date: Oct. 26, 2016

(87) PCT Pub. No.: WO2016/108306
PCT Pub. Date: Jul. 7, 2016

(65) Prior Publication Data
US 2017/0052071 A1 Feb. 23, 2017

(51) Int. Cl.
*G01J 5/22* (2006.01)
*H01L 29/24* (2006.01)
(Continued)

(52) U.S. Cl.
CPC ............... *G01J 5/22* (2013.01); *H01L 29/24* (2013.01); *H01L 29/66977* (2013.01);
(Continued)

(58) Field of Classification Search
CPC ...... G01J 5/22; H01L 29/24; H01L 29/66977; H01L 29/1606; H01L 29/778; H03B 9/08; H05H 1/46; H05H 2001/4607
(Continued)

(56) References Cited

U.S. PATENT DOCUMENTS 3,749,915 A * 7/1973 Hagood .................... G01T 1/16
250/336.1
4,721,983 A * 1/1988 Frazier ................... B82Y 10/00
257/24
(Continued)

FOREIGN PATENT DOCUMENTS

JP 6-120731 A 4/1994
JP 2009-105102 A 5/2009
(Continued)

OTHER PUBLICATIONS

Patent Cooperation Treaty, International Search Report and Written Opinion of the International Searching Authority, International Application No. PCT/KR2014/03049, dated Sep. 24, 2015, 9 Pages (with English Translation).
(Continued)

*Primary Examiner* — David Porta
*Assistant Examiner* — Blake Riddick
(74) *Attorney, Agent, or Firm* — Fenwick & West LLP

(57) ABSTRACT

An electromagnetic wave generator includes a 2DEG plate, a first resistor, a second resistor, a source and a floating plate and a dielectric body. The 2DEG plate is configured to form a 2DEG channel. The first resistor is connected to one side node of the 2DEG plate. The second resistor is connected to an opposite side node of the 2DEG plate. The source is disposed between the second resistor and a ground and configured to apply electric power to the 2DEG plate. The floating plate is configured to generate an electromagnetic
(Continued)

wave using electric dipoles formed by the 2DEG channel. The dielectric body is formed between the 2DEG plate and the floating plate.

18 Claims, 4 Drawing Sheets

(51) Int. Cl.
    *H01L 29/66*     (2006.01)
    *H03B 9/08*     (2006.01)
    *H05H 1/46*     (2006.01)
    *H01L 29/16*     (2006.01)
    *H01L 29/778*     (2006.01)

(52) U.S. Cl.
    CPC ............... *H03B 9/08* (2013.01); *H05H 1/46* (2013.01); *H01L 29/1606* (2013.01); *H01L 29/778* (2013.01); *H05H 2001/4607* (2013.01)

(58) Field of Classification Search
    USPC ...... 250/338.4, 338.1, 493.1, 504 R; 331/79, 331/86, 96
    See application file for complete search history.

(56) References Cited

U.S. PATENT DOCUMENTS

| | | | | |
|---|---|---|---|---|
| 4,989,053 A * | 1/1991 | Shelton | ............... | H01L 29/7883 257/300 |
| 5,559,343 A * | 9/1996 | Kiehl | ............... | B82Y 10/00 257/14 |
| 8,253,104 B2 | 8/2012 | Kawano et al. | | |
| 9,509,284 B2 * | 11/2016 | Haeberlen | ............... | H03K 3/012 |
| 2003/0127673 A1 * | 7/2003 | Williamson | ............ | H01L 31/09 257/293 |
| 2005/0230705 A1 * | 10/2005 | Taylor | ............... | B82Y 20/00 257/120 |
| 2006/0205127 A1 * | 9/2006 | Kwon | ............... | G02B 6/12004 438/172 |
| 2008/0087917 A1 * | 4/2008 | Briere | ............... | H01L 29/4232 257/194 |
| 2010/0051812 A1 * | 3/2010 | Kawano | ............... | H01L 31/1035 250/338.2 |
| 2010/0084570 A1 * | 4/2010 | Katagiri | ............... | G02F 1/025 250/458.1 |
| 2011/0031378 A1 * | 2/2011 | Hirose | ............... | H01L 31/10 250/208.1 |
| 2011/0204418 A1 | 8/2011 | Onishi et al. | | |
| 2011/0254610 A1 * | 10/2011 | Pfeiffer | ............... | H03D 1/18 327/356 |
| 2012/0243823 A1 * | 9/2012 | Giboney | ............... | H01P 1/162 385/14 |
| 2012/0293272 A1 * | 11/2012 | Yoder | ............... | H01Q 1/38 331/108 R |
| 2013/0277716 A1 * | 10/2013 | Otsuji | ............... | H01L 29/42316 257/252 |
| 2014/0008616 A1 * | 1/2014 | Geim | ............... | H01L 29/1606 257/24 |
| 2014/0175451 A1 * | 6/2014 | Bhalla | ............... | H01L 29/2003 257/76 |
| 2014/0197896 A1 * | 7/2014 | Ouchi | ............... | H03B 7/08 331/107 T |
| 2015/0295072 A1 * | 10/2015 | Rezanezhad Gatabi | ............... | H01L 29/2003 257/29 |
| 2015/0340483 A1 * | 11/2015 | Briere | ............... | H01L 29/404 257/194 |
| 2016/0037111 A1 * | 2/2016 | Dai | ............... | H04N 5/378 250/208.1 |

FOREIGN PATENT DOCUMENTS

| | | |
|---|---|---|
| JP | 5107183 B2 | 10/2012 |
| KR | 10-2014-0027958 A | 3/2014 |
| WO | WO 2012/073298 | 6/2012 |
| WO | WO 2012/073298 | 5/2014 |

OTHER PUBLICATIONS

Office Action for Japanese Patent Application No. JP 2016-566945, dated Jan. 30, 2018, 16 Pages.

\* cited by examiner

ELECTROMAGNETIC WAVE OSCILLATOR, PLASMA WAVE POWER EXTRACTOR AND ELECTROMAGNETIC WAVE DETECTOR

TECHNICAL FIELD

The present invention relates to an electromagnetic wave generator, a plasma wave power extractor and electromagnetic wave detector and, more particularly, to an electromagnetic wave generator capable of inducing a plasma wave through the use of a two-dimensional electron gas (2DEG) structure and capable of generating an electromagnetic wave of a terahertz band through the use of a floating plate, a plasma wave power extractor and an electromagnetic wave detector.

BACKGROUND ART

In recent years, as a laser strong instantaneous output power having a pulse width of femtoseconds has been developed, in order to generate an electric wave of a terahertz region, research is being conducted on terahertz electromagnetic wave generation that makes use of a uni-axial dielectric crystal, a semiconductor or a low-temperature superconductor used as an emitter of a terahertz region.

In this regard, a terahertz electromagnetic wave emitter is realized as an electromagnetic wave ordinary-temperature emitter that makes use of a zinc-cadmium-tellurium-based mono-crystal. In this connection, Korean Patent. Application Publication No. 2003-0095533 (published on Dec. 24, 2003) as a related art discloses an emitter which operates as a ultra-high speed element by generating a single shot signal of picoseconds or less, wherein the single shot signal has an ultra-wide signal band of about several terahertz in a direct current.

However, optical system is required to use a crystal. In an effort to supplement this problem, there has been used an FET-type terahertz emitter using a gate. In a semiconductor-type structure, however, due to the contact of a gate, the mobility of 2DEG channel may be reduced and the performance may be restricted depending on the channel length. Furthermore, in the case of an FET-type terahertz detector, there are required a boundary condition and an element structure different from those of an FET-type terahertz generator.

SUMMARY OF THE INVENTION

Technical Problems

An embodiment of the present invention can provide an electromagnetic wave generator capable of inducing a plasma wave through the use of an element structure which forms 2DEG channel and capable of generating an electromagnetic wave of a terahertz band by generating plasma-wave-caused electric dipoles through the use of a floating plate, a plasma wave power extractor and an electromagnetic wave detector. However, the problems to be solved by the present invention are not limited to the aforementioned ones. Other technical problems may exist.

Means for Solving the Problems

As a means for solving the aforementioned technical problems, an embodiment of the present invention provides an electromagnetic wave generator, including: a 2DEG (two-dimensional electron gas) plate configured to form a 2DEG channel; a first resistor connected to one side node of the 2DEG plate; a second resistor connected to an opposite side node of the 2DEG plate; a source disposed between the second resistor and a ground and configured to apply electric power to the 2DEG plate; a floating plate configured to generate an electromagnetic wave using electric dipoles formed by the 2DEG channel; and a dielectric body formed between the 2DEG plate and the floating plate.

Another embodiment of the present invention provides a plasma wave power extractor, including: a 2DEG plate configured to form a 2DEG channel, a first resistor connected to one side node of the 2DEG plate, a second resistor connected to an opposite side node of the 2DEG plate, a source disposed between the second resistor and a ground and configured to apply electric power to the 2DEG plate, and an extractor configured to extract electric power from a drain node between the 2DEG plate and the second resistor when a plasma wave is formed in the 2DEG plate by the source.

Still another embodiment of the present invention provides an electromagnetic wave detector, including: a floating plate on which an electromagnetic wave is irradiated to form electric dipoles; a 2DEG plate in which a 2DEG channel is formed by the electric dipoles to detect a 2DEG resonance; a first resistor connected to one side node of the 2DEG plate; a second resistor connected to an opposite side node of the 2DEG plate; a source disposed between the second resistor and a ground and configured to apply electric power to the 2DEG plate; and a dielectric body formed between the 2DEG plate and the floating plate.

Effects of the Invention

According to the aforementioned means for solving the problems, it is possible to increase the mobility of the 2DEG, control the plasma wave using the dielectric body, amplify the plasma wave using the boundary condition, generate a transverse electromagnetic (TEM) wave of a terahertz band using the floating plate, and use both the generator and the detector in the same element structure through the introduction of the floating plate.

BEST MODE FOR CARRYING OUT THE INVENTION

Figure 1A:
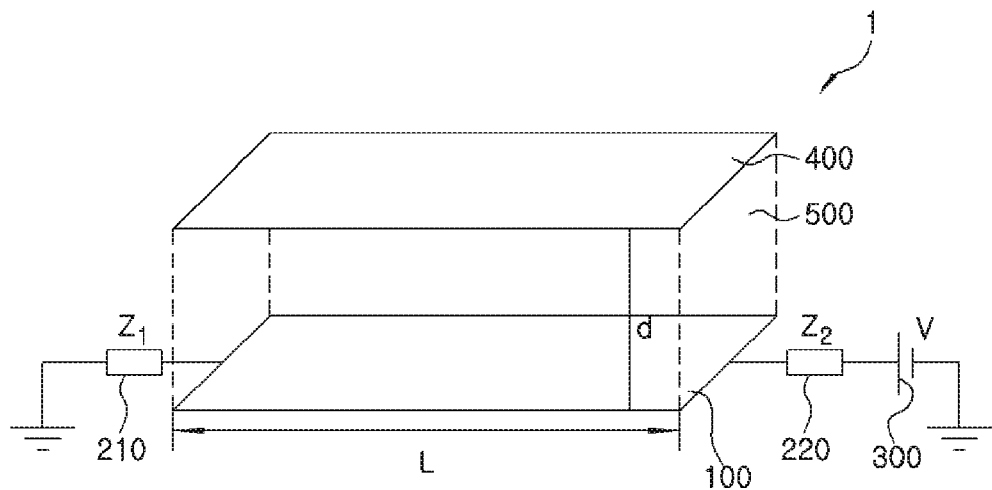
FIGS. 1A and 1B are circuit diagrams of an electromagnetic wave generator according to an embodiment of the present invention.

Embodiments of the present invention will now be described in detail with reference to the accompanying drawings so that a person having an ordinary knowledge in the technical field to which the present invention pertains can easily carry out the invention. However, the present invention can be realized in many different forms and shall not be limited to the embodiments described herein. In the drawings, the portions having nothing to do with the descriptions are omitted in order to clearly describe the present invention. Through the specification, similar portions are designated by like reference symbols.

In the specification, when saying that one component is "connected" to another component, it is intended to include not only a case where one component is "directly connected" to another component but also a case where one component is "electrically connected" to another component through the intervention of other element. Furthermore, when saying that one component "includes" another component, it is meant that other component is not excluded but may be further included unless specifically mentioned otherwise and it is to be understood that the possibility of existence or addition of one or more other features, numbers, steps, operations, components and parts or the combinations thereof is not excluded.

Hereinafter, the present invention will be described in detail with reference to the accompanying drawings.

Figure 1B:
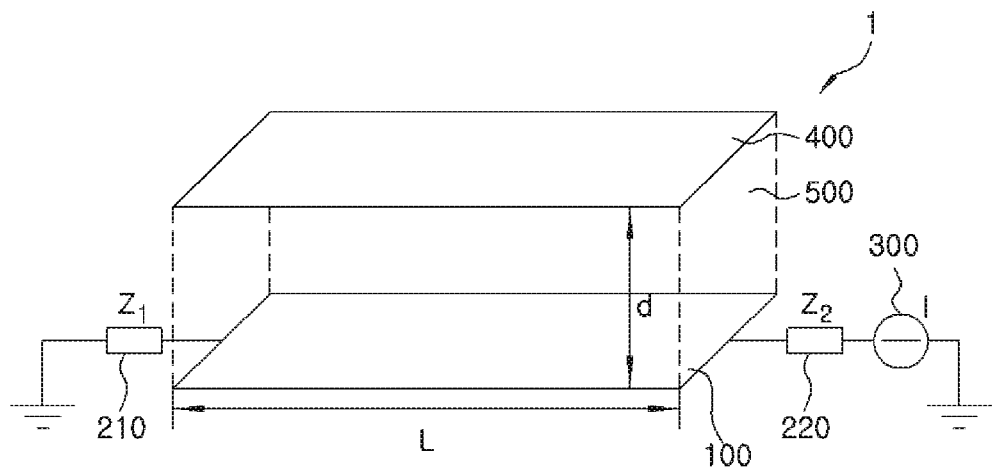
Figure 2A:
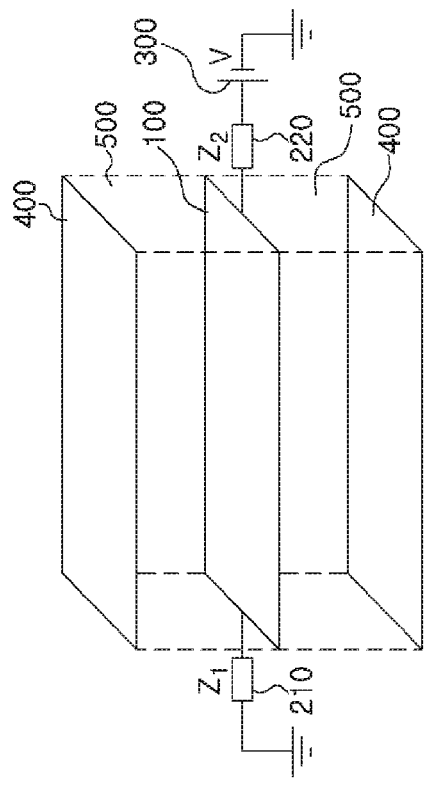
FIGS. 2A and 2B are circuit diagrams illustrating other examples of the electromagnetic wave generator illustrated in FIGS. 1A and 1B.
Figure 2B:
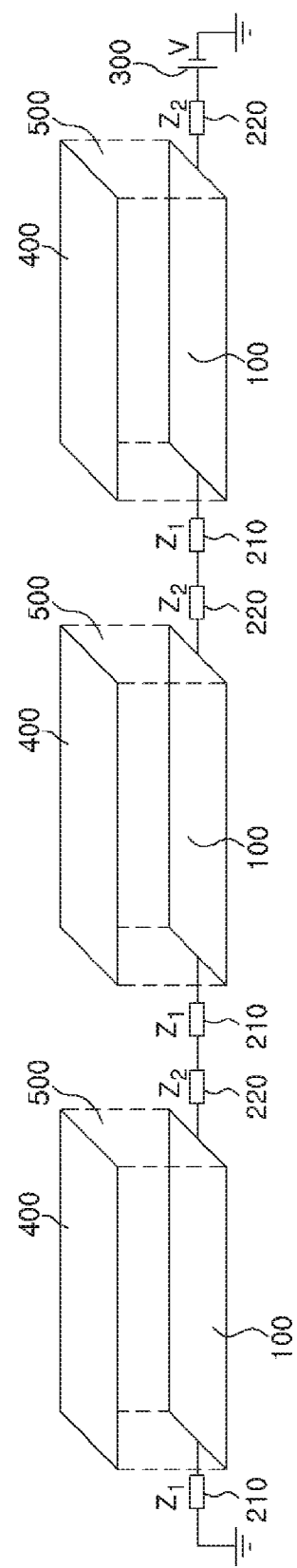
Figure 3A:
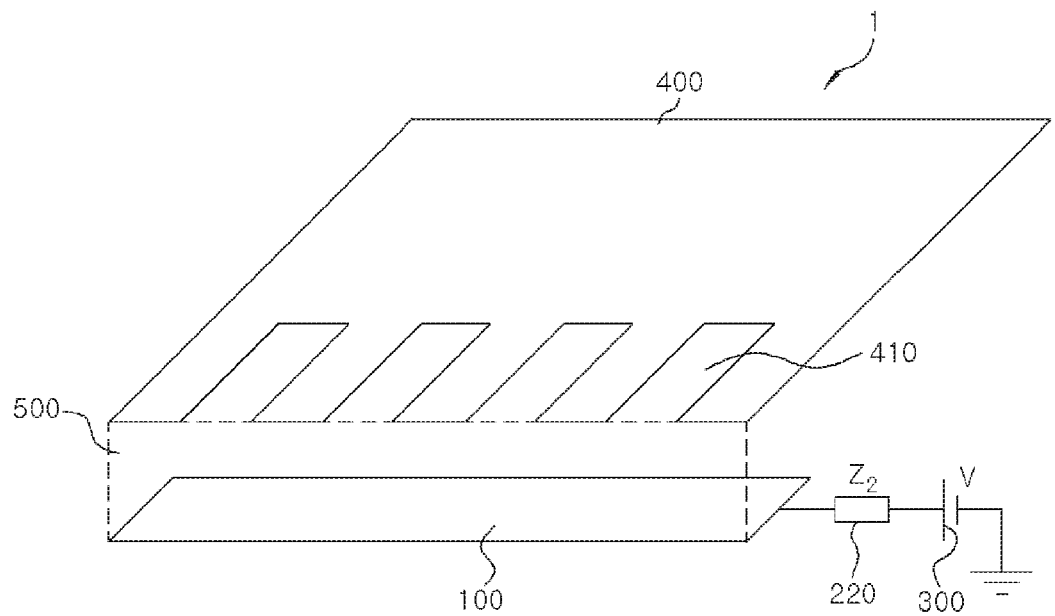
FIGS. 3A and 3B are circuit diagrams illustrating still other examples of the electromagnetic wave generator illustrated in FIGS. 1A and 1B.
Figure 3B:
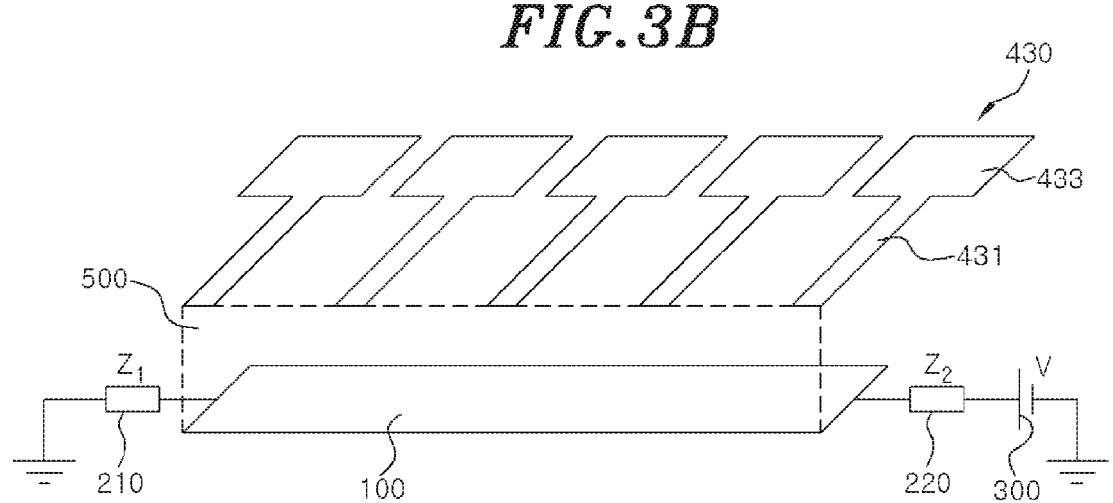

FIGS. 1A and 1B are circuit diagrams of an electromagnetic wave generator according to an embodiment of the present invention. FIGS. 2A and 2B are circuit diagrams illustrating other examples of the electromagnetic wave generator illustrated in FIGS. 1A and 1B. FIGS. 3A and 3B are circuit diagrams illustrating still other examples of the electromagnetic wave generator illustrated in FIGS. 1A and 1B.

FIG. 1A illustrates an example in which the source 300 of the electromagnetic wave generator 1 is expressed as a voltage source. FIG. 1B illustrates another example in which the source 300 of the electromagnetic wave generator 1 is expressed as a current source. Referring to FIGS. 1A and 1B, the electromagnetic wave generator 1 may include a 2DEG plate 100, a first resistor 210, a second resistor 220, a source 300, a floating plate 400 and a dielectric body 500.

The electromagnetic wave generator 1 according to one embodiment of the present invention may realize a boundary condition using the first resistor 210, the second resistor 230 and the source 300 which are connected to opposite sides of the 2DEG plate 100. The electromagnetic wave generator 1 may generate a longitudinal plasma wave having a frequency of terahertz (THz) which is amplified over time within a range of a resonance cavity length L. By positioning the floating plate 400 spaced apart by a distance "d" from the 2DEG plate 100, it is possible to form electric dipoles corresponding to the longitudinal plasma wave generated in a conductive electric wire. Furthermore, using the electric dipoles, the electromagnetic wave generator 1 can generate a TEM wave (transverse electromagnetic wave) corresponding to the frequency of the longitudinal plasma wave.

The 2DEG plate 100 is configured to form a 2DEG channel and may be made of a metal, a semi-metal or a semiconductor material such as a graphene, $MoS_2$ or the like. The longitudinal plasma wave generated in the 2DEG plate 100 may be amplified depending on the boundary condition.

The first resistor 210 may be connected to one node of the 2DEG plate 100. The second resistor 220 may be connected to the other node of the 2DEG plate 100. Furthermore, the boundary condition may be such that the first resistor 210 with zero impedance forms a short circuit and the second resistor 220 with infinite impedance forms an open circuit.

The source 300 is disposed between the second resistor 220 and a ground and may apply electric power to the 2DEG plate 100. The source 300 may be expressed as a voltage source or a current source. The 2DEG channel is controlled by the source 300, whereby the longitudinal plasma wave can be generated in the 2DEG plate 100.

Referring to mathematical formulae (1) and (2) described below, an electron drift velocity $V_0$ is applied to the 2DEG plate 100 through the application of a voltage V of the source 300. If an imaginary number component $\omega''$ of an angular frequency ($\omega=\omega'+j\omega''$) of the longitudinal plasma wave becomes larger than 0, the plasma wave of a resonance cavity of the 2DEG plate 100 may be amplified. When the velocity s of the longitudinal plasma wave is larger than $V_0$, as represented by mathematical formula (1), the frequency f of the longitudinal plasma wave is inversely proportional to the square root of L and is proportional to the square root of the surface electron density $n_0$. The floating plate 400 may be used to generate the longitudinal plasma wave as a TEM wave. In this regard, if the dielectric body 500 of boron nitride having a property of vacuum or a similar property is disposed between the floating plate 400 and the 2DEG plate 100, it is possible to suppress the influence of surface roughness and scattering, thereby increasing the intrinsic mobility of a 2DEG material. At the same time, if a material having no band gap or a narrow band gap is used, it is possible to adjust the surface electron density $n_0$ by using the voltage v so that the longitudinal plasma wave could be adjusted to fall within a desired frequency band.

$$\omega' = \pi\sqrt{\frac{n_0 e^2}{\varepsilon m L}} N \tag{1}$$

$$\omega'' = \frac{v_0}{L} - \frac{1}{2\tau_p} \tag{2}$$

In mathematical formulae (1) and (2), m is an effective electron mass, L is a resonance cavity length, $\tau_p$ is a momentum relaxation time, and e is an elementary electronic charge amount.

That is to say, the floating plate 400 generates an electromagnetic wave as the electric dipoles are formed by the 2DEG channel. The electromagnetic wave is a TEM wave of a terahertz band. The floating plate 400 may be a conductor or a semiconductor.

The dielectric body 500 may be formed between the 2DEG plate 100 and the floating plate 400. In this regard, the dielectric body 500 may be vacuum or boron nitride.

Referring to FIG. 2A, a plurality of floating plates 400 may be provided to be positioned above an upper surface of the 2DEG plate 100 or below a lower surface of the 2DEG plate 100. As shown in FIG. 2B, if it is assumed that the 2DEG plate 100, the dielectric body 500 and the floating plate 400 define a generator unit together, there may be provided a plurality of generator units, a plurality of first resistors 210 and a plurality of second resistors 220 which are serially connected to one another. One side node of the first one of the plurality of serially-connected first resistors 210 may be grounded. The source 300 may be connected to the other side node of the last one of the plurality of serially-connected second resistors 220.

Referring to FIG. 3A, the floating plate 400 may have at least one recess portion 410 perpendicular to the longitudinal direction of the 2DEG plate 100.

That is to say, the floating plate 400, which is used for the purpose of extracting electric power, may be realized in many different forms such as a grating structure or the like, in addition to a single floating plate 400, in order to improve the performance. Thus, referring the FIG. 3B, the floating plate 400 includes at least one unit plate 430. The unit plate 430 includes a strip portion 431 and a patch portion 433. The width of the strip portion 431 may be smaller than the width of the patch portion 433. The length of the strip portion 431 may be larger than the length of the patch portion 433.

Figure 4:
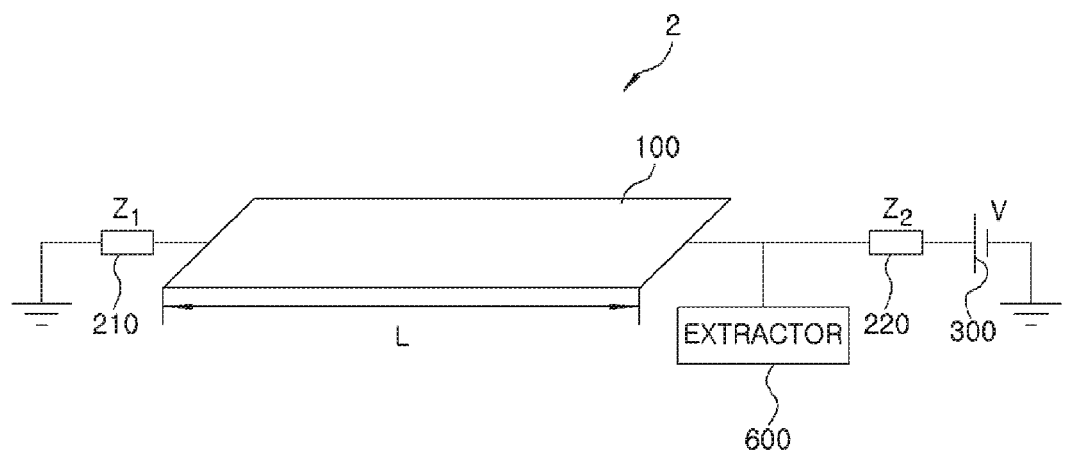
FIG. 4 is a circuit diagram of a power extractor according to another embodiment of the present invention.
Figure 5:
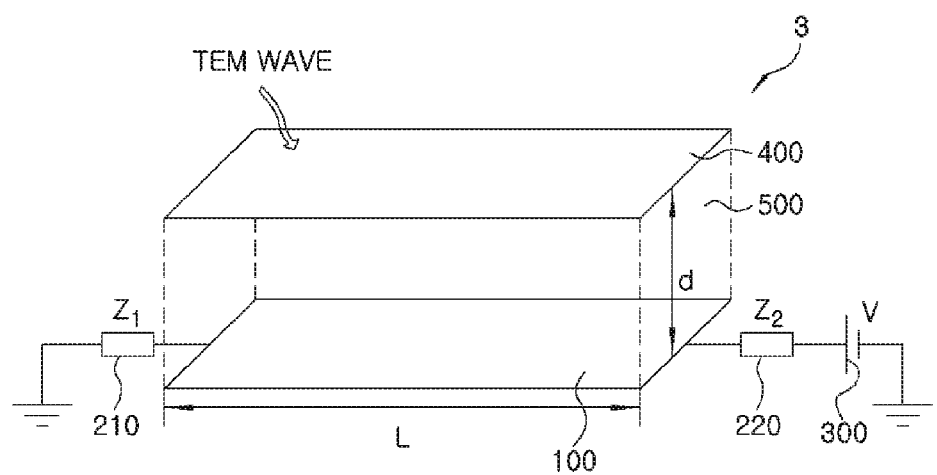
FIG. 5 is a circuit diagram of an electromagnetic wave detector according to still another embodiment of the present invention.

FIG. 4 is a circuit diagram of a power extractor according to another embodiment of the present invention. Referring to FIG. 4, the power extractor 2 may include a 2DEG plate 100 configured to form a 2DEG channel, a first resistor 210 connected to one side node of the 2DEG plate 100, a second resistor 220 connected to an opposite side node of the 2DEG plate 100, a source 300 disposed between the second resistor 220 and a ground and configured to apply electric power to the 2DEG plate 100, and an extractor 600 configured to extract electric power from a drain node between the 2DEG plate 100 and the second resistor 220 when a plasma wave is formed in the 2DEG plate 100 by the source 300. That is to say, a current is caused to flow the voltage V of the source 300. Electric power can be extracted from the drain node in a state in which the plasma wave is generated by the current. In this regard, the power extractor illustrated in FIG. 4 may be provided in each of the electromagnetic wave generators illustrated in FIGS. 1A to 3B and the electromagnetic wave detector illustrated in FIG. 5. Since only the 2DEG plate is used, it is possible to use the 2DEG plate at any time before the floating plate the electromagnetic wave generator illustrated in FIGS. 1A to 3B or the electromagnetic wave detector illustrated in FIG. 5 is provided. Furthermore, the various shapes illustrated in FIGS. 2A to 3B may be applied to the electromagnetic wave detector illustrated in FIG. 5. In addition, the power extractor is used to detect the electric power of the plasma wave converted from the electromagnetic wave incident on the floating plate. Thus, the power extractor can be used in both the electromagnetic wave generator and the electromagnetic wave detector.

The matters not described with respect to the power extractor illustrated in FIG. 4 are the same as, or can be easily inferred from, the contents previously described with respect to the electromagnetic wave generators illustrated in FIGS. 1A to 3B. Therefore, descriptions thereof are omitted.

FIG. 5 is a circuit diagram of an electromagnetic wave detector according to still another embodiment of the present invention. Referring to FIG. 5, the electromagnetic wave detector 3 has the same structure as the electromagnetic wave generators 1 illustrated in FIGS. 1A to 2B and may serve as a terahertz electromagnetic wave detector which detects a 2DEG resonance and a DC voltage by irradiating a terahertz electromagnetic wave on the floating plate 400.

The electromagnetic wave detector 3 is of a slot antenna type but is configured to form electric dipoles and detect an electromagnetic wave by directly receiving a terahertz electromagnetic wave with the floating plate 400 instead of directly receiving a terahertz electromagnetic wave with the 2DEG plate 100. In the regard, the floating plate 400 is of a patch antenna type and operates as a dipole antenna. The floating plate 400 may be variously formed as illustrated in FIGS. 2A to 3B. This enables the electromagnetic wave detector 3 to detect a 2DEG resonance and a DC voltage.

The electromagnetic wave detector 3 used for this purpose may include a floating plate 400 on which an electromagnetic wave is irradiated to form electric dipoles, a 2DEG plate 100 in which a 2DEG channel is formed by the electric dipoles to detect a 2DEG resonance, a first resistor 210 connected to one side node of the 2DEG plate 100, a second resistor 220 connected to an opposite side node of the 2DEG plate 100, a source 300 disposed between the second resistor 220 and the ground and configured to apply electric power to the 2DEG plate 100, and a dielectric body 500 formed between the 2DEG plate 100 and the floating plate 400.

A plurality of floating plates 400 may be provided to be positioned above an upper surface of the 2DEG plate 100 or below a lower surface of the 2DEG plate 100. If it is assumed that the 2DEG plate 100, the dielectric body 500 and the floating plate 400 define a generator unit together, there may be provided a plural generator units, a plurality of first resistors 210 and a plurality of second resistors 220 which are serially connected to one another. One side node of the first one of the plurality of serially-connected first resistors 210 may be grounded. The source 300 may be connected to the other side node of the last one of the plurality of serially-connected second resistors 220.

The floating plate 400 may have at least one recess portion 410 perpendicular to the longitudinal direction of the 2DEG plate 100.

That is to say, the floating plate 400, which is used for the purpose of detecting an electromagnetic wave, may be realized in various forms such as a grating structure or the like, in addition to a single floating plate 400, in order to improve the performance. Thus, the floating plate 400 includes at least one unit plate 430. The unit plate 430 includes a strip portion 431 and a patch portion 433. The width of the strip portion 431 may be smaller than the width of the patch portion 433. The length of the strip portion 431 may be larger than the length of the patch portion 433.

In the case where a resonance cavity of L=300 and W=100 nm is made by a graphene ($m_c^*$=0.02 $m_0$ and $\mu$=200,000 cm$^2$/V$_s$) using the aforementioned structure, if a 2DEG of $n_0$~$1\times10^{14}$ cm$^{-2}$ is formed by applying a constant voltage, the plasma wave thus generated has a band of f=1.38 THz. It is therefore possible to realize a terahertz emitter that generates electric power of P=10.7 µW.

According to one embodiment of the present invention, the relatively-low mobility attributable to surface roughness, which has become a problem in a FET-based terahertz emitter, can be improved through the use of the vacuum gap and the dielectric body having a property similar to that of the vacuum gap. Further, the frequency which has been proportional to L becomes inversely proportional to the square root of L. This makes it possible to realize a terahertz emitter at a larger cavity length using the floating plate. Furthermore, the materials, which have been theoretically and technically difficult to be used in the conventional FET-based terahertz emitter, can be used in a terahertz emitter having enhanced characteristics through the use of the structure according to one embodiment of the present invention.

The foregoing descriptions of the present invention are presented for the purpose of illustration. A person having an ordinary knowledge in the technical field to which the present invention pertains will be able to understand that the present invention can be easily modified in other specific forms without changing the technical idea or the essential features of the present invention. Thus, it is to be understood that the embodiments described above is exemplary and not limitative in all respects. For example, each of the components described as being a singular form may be embodied in a plural form. Similarly, the components described as being a plural form may be embodied in a combined form.

The scope of the present invention shall not be defined by the foregoing detailed descriptions but shall be determined by the appended claims. All modifications and changes derived from the meaning and scope of the claims and the equivalent concept thereof shall be construed to fall within the scope of the present invention.

What is claimed is:

1. An electromagnetic wave generator, comprising:
   a 2DEG (two-dimensional electron gas) plate configured to form a 2DEG channel;
   a first resistor directly connected to one side node of the 2DEG plate and a ground, respectively;
   a second resistor whose one end is directly connected to an opposite side node of the 2DEG plate;
   a source directly and serially connected to the other end of the second resistor and the ground and configured to apply electric power to the 2DEG plate;
   a floating plate configured to generate an electromagnetic wave using electric dipoles formed by the 2DEG channel; and
   a dielectric body formed between the 2DEG plate and the floating plate.

2. The electromagnetic wave generator of claim 1, wherein the source is a voltage source or a current source, and the 2DEG channel is controlled by the source so that a longitudinal plasma wave is generated in the 2DEG plate.

3. The electromagnetic wave generator of claim 1, wherein a boundary condition is such that the first resistor with zero impedance forms a short circuit and the second resistor with infinite impedance forms an open circuit.

4. The electromagnetic wave generator of claim 3, wherein a longitudinal plasma wave generated in the 2DEG plate is amplified by the boundary condition.

5. The electromagnetic wave generator of claim 1, wherein the dielectric body is vacuum or boron nitride.

6. The electromagnetic wave generator of claim 1, wherein the 2DEG plate is made of graphene or MoS2.

7. The electromagnetic wave generator of claim 1, wherein the floating plate is a conductor or a semiconductor.

8. The electromagnetic wave generator of claim 1, wherein the electromagnetic wave is a TEM (transverse electromagnetic) wave of a terahertz band.

9. The electromagnetic wave generator of claim 1, wherein the floating plate includes a plurality of floating plates positioned above an upper surface of the 2DEG plate or below a lower surface of the 2DEG plate.

10. The electromagnetic wave generator of claim 1, wherein the 2DEG plate, the dielectric body and the floating plate define a generator unit together,
    wherein the generator unit includes a plurality of generator units, the first resistor includes a plurality of first resistors, and the second resistor includes a plurality of second resistors,
    wherein the first resistors, the generator units, and the second resistors are serially-connected with each other,
    wherein one side node of the first one of the serially-connected first resistors is grounded, and
    the source is connected to the other side node of the last one of the serially-connected second resistors.

11. The electromagnetic wave generator of claim 1, wherein the floating plate has at least one recess portion perpendicular to a longitudinal direction of the 2DEG plate.

12. The electromagnetic wave generator of claim 1, wherein the floating plate includes at least one unit plate, the unit plate includes a strip portion and a patch portion, the strip portion has a width smaller than a width of the patch portion, and the strip portion has a length larger than a length of the patch portion.

13. A plasma wave power extractor, comprising:
    a 2DEG (two-dimensional electron gas) plate configured to form a 2DEG channel;
    a first resistor directly connected to one side node of the 2DEG plate and a ground, respectively;
    a second resistor whose one end is directly connected to an opposite side node of the 2DEG plate;
    a source directly and serially connected to the other end of the second resistor and the ground and configured to apply electric power to the 2DEG plate; and
    an extractor directly connected to the one end of the second resistor and the opposite side node of the 2DEG plate, respectively, and configured to extract electric power from a drain node between the 2DEG plate and the second resistor when a plasma wave is formed in the 2DEG plate by the source.

14. An electromagnetic wave detector, comprising:
    a floating plate on which an electromagnetic wave is irradiated to form electric dipoles;
    a 2DEG (two-dimensional electron gas) plate in which a 2DEG channel is formed by the electric dipoles to detect a 2DEG resonance;
    a first resistor directly connected to one side node of the 2DEG plate and a ground, respectively;
    a second resistor whose one end is directly connected to an opposite side node of the 2DEG plate;
    a source directly and serially connected to the other end of the second resistor and the ground and configured to apply electric power to the 2DEG plate; and
    a dielectric body formed between the 2DEG plate and the floating plate.

15. The electromagnetic wave detector of claim 14, wherein the floating plate includes a plurality of floating plates positioned above an upper surface of the 2DEG plate or below a lower surface of the 2DEG plate.

16. The electromagnetic wave detector of claim 14, wherein the 2DEG plate, the dielectric body and the floating plate define a generator unit together,
    wherein the generator unit includes a plurality of generator units, the first resistor includes a plurality of first resistors, and the second resistor includes a plurality of second resistors,
    wherein the first resistors, the generator units and the second resistors are serially-connected with each other,
    wherein one side node of the first one of the serially-connected first resistors is grounded, and
    the source is connected to the other side node of the last one of the serially-connected second resistors.

17. The electromagnetic wave detector of claim 14, wherein the floating plate has at least one recess portion perpendicular to a longitudinal direction of the 2DEG plate.

18. The electromagnetic wave detector of claim 14, wherein the floating plate includes at least one unit plate, the unit plate includes a strip portion and a patch portion, the strip portion has a width smaller than a width of the patch portion, and the strip portion has a length larger than a length of the patch portion.

* * * * *

UNITED STATES PATENT AND TRADEMARK OFFICE
CERTIFICATE OF CORRECTION

PATENT NO. : 10,161,804 B2  
APPLICATION NO. : 15/306927  
DATED : December 25, 2018  
INVENTOR(S) : Kyung Rok Kim et al.

Page 1 of 1

It is certified that error appears in the above-identified patent and that said Letters Patent is hereby corrected as shown below:

On the Title Page

Item (73), Assignee:
Delete "UNIST (ULSAN NATIONAL INSTITUTE OF SCIENCE AND TECHNOLOGY), Ulsan (KR)" and insert --UNIST (ULSAN NATIONAL INSTITUTE OF SCIENCE AND TECHNOLOGY), Ulsan (KR) and KOREA ADVANCED INSTITUTE OF SCIENCE AND TECHNOLOGY, Daejon (KR)--

Signed and Sealed this  
Twenty-seventh Day of August, 2019

Andrei Iancu  
*Director of the United States Patent and Trademark Office*